United States Patent
Ito

(10) Patent No.: US 9,123,807 B2
(45) Date of Patent: Sep. 1, 2015

(54) REDUCTION OF PARASITIC CAPACITANCE IN A SEMICONDUCTOR DEVICE

(75) Inventor: Akira Ito, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 249 days.

(21) Appl. No.: 13/019,695

(22) Filed: Feb. 2, 2011

(65) Prior Publication Data

US 2012/0161233 A1    Jun. 28, 2012

Related U.S. Application Data

(60) Provisional application No. 61/427,595, filed on Dec. 28, 2010.

(51) Int. Cl.
| H01L 29/66 | (2006.01) |
| H01L 29/78 | (2006.01) |
| H01L 29/10 | (2006.01) |
| H01L 29/45 | (2006.01) |
| H01L 29/49 | (2006.01) |

(52) U.S. Cl.
CPC ........ *H01L 29/7835* (2013.01); *H01L 29/4983* (2013.01); *H01L 29/1045* (2013.01); *H01L 29/456* (2013.01); *H01L 29/4933* (2013.01)

(58) Field of Classification Search
CPC ..................... H01L 29/4983; H01L 29/66681; H01L 29/7801; H01L 29/7816
See application file for complete search history.

(56) References Cited

U.S. PATENT DOCUMENTS

| 4,902,639 A | 2/1990 | Ford |
| 5,031,008 A * | 7/1991 | Yoshida ........................ 257/343 |
| 5,407,844 A * | 4/1995 | Smayling et al. ............. 438/234 |
| 5,501,996 A | 3/1996 | Yang et al. |
| 5,583,067 A | 12/1996 | Sanchez |
| 5,742,084 A | 4/1998 | Yu |
| 5,801,416 A | 9/1998 | Choi et al. |
| 5,844,275 A | 12/1998 | Kitamura et al. |
| 5,910,673 A | 6/1999 | Hsu et al. |
| 5,918,133 A | 6/1999 | Gardner et al. |
| 5,943,575 A | 8/1999 | Chung |
| 5,981,997 A | 11/1999 | Kitamura |
| 6,034,388 A | 3/2000 | Brown et al. |
| 6,049,119 A | 4/2000 | Smith |
| 6,077,749 A | 6/2000 | Gardner et al. |

(Continued)

OTHER PUBLICATIONS

Co-pending U.S. Appl. No. 13/567,524, Ito, filed Aug. 6, 2012 (not published).

(Continued)

*Primary Examiner* — Benjamin Sandvik
(74) *Attorney, Agent, or Firm* — Sterne, Kessler, Goldstein & Fox P.L.L.C.

(57) ABSTRACT

An apparatus is disclosed to increase a reduced a parasitic capacitance of a semiconductor device. The semiconductor device includes a modified gate region to effectively reduce an overlap capacitance and modified well regions to effectively reduce a junction capacitance. The modified gate region includes a doped region and an undoped to decrease an effective area of the overlap capacitance. The modified well regions are separated by a substantially horizontal distance to increase an effective distance of the junction capacitance. This decrease in the effective area of the overlap capacitance and this increase in the effective distance of the junction capacitance reduces the parasitic capacitance of the semiconductor device.

29 Claims, 8 Drawing Sheets

(56) References Cited

U.S. PATENT DOCUMENTS

| | | |
|---|---|---|
| 6,121,666 A | 9/2000 | Burr |
| 6,172,401 B1 | 1/2001 | Brand |
| 6,177,324 B1 | 1/2001 | Song et al. |
| 6,200,843 B1 | 3/2001 | Bryant et al. |
| 6,204,537 B1 | 3/2001 | Ma |
| 6,211,552 B1 | 4/2001 | Efland et al. |
| 6,242,787 B1 | 6/2001 | Nakayama et al. |
| 6,392,274 B1 | 5/2002 | Tung |
| 6,424,005 B1 | 7/2002 | Tsai et al. |
| 6,441,431 B1 | 8/2002 | Efland et al. |
| 6,465,307 B1 | 10/2002 | Chidambaram et al. |
| 6,548,874 B1 * | 4/2003 | Morton et al. ............. 257/371 |
| 6,580,156 B1 | 6/2003 | Ito et al. |
| 6,620,656 B2 | 9/2003 | Min et al. |
| 6,680,515 B1 | 1/2004 | Hsing |
| 6,700,176 B2 | 3/2004 | Ito et al. |
| 6,707,112 B2 | 3/2004 | Kachelmeier |
| 6,724,047 B2 * | 4/2004 | Unnikrishnan ............. 257/347 |
| 6,744,101 B2 | 6/2004 | Long et al. |
| 6,798,684 B2 | 9/2004 | Low et al. |
| 6,876,035 B2 | 4/2005 | Abadeer et al. |
| 6,878,603 B2 | 4/2005 | Bromberger et al. |
| 6,888,205 B2 | 5/2005 | Moscatelli et al. |
| 6,900,101 B2 | 5/2005 | Lin |
| 6,960,819 B2 | 11/2005 | Chen et al. |
| 7,101,764 B2 | 9/2006 | Petti |
| 7,161,213 B2 | 1/2007 | Ito et al. |
| 7,297,582 B2 | 11/2007 | Abadeer et al. |
| 7,345,341 B2 | 3/2008 | Lin et al. |
| 7,348,247 B2 | 3/2008 | Park et al. |
| 7,348,256 B2 | 3/2008 | Miller, Jr. et al. |
| 7,372,104 B2 | 5/2008 | Wu et al. |
| 7,402,855 B2 | 7/2008 | Kurjanowicz |
| 7,405,443 B1 | 7/2008 | Zuniga et al. |
| 7,405,446 B2 | 7/2008 | Agam et al. |
| 7,462,906 B2 | 12/2008 | Lu et al. |
| 7,528,453 B2 | 5/2009 | Holz et al. |
| 7,602,017 B2 | 10/2009 | Cai |
| 7,662,697 B2 | 2/2010 | Ahn et al. |
| 7,821,062 B2 | 10/2010 | Gossner |
| 7,855,414 B2 | 12/2010 | Ito et al. |
| 7,893,494 B2 * | 2/2011 | Chang et al. ............. 257/347 |
| 8,120,106 B2 | 2/2012 | Hsieh |
| 8,148,777 B1 | 4/2012 | Bulucea |
| 8,203,188 B2 | 6/2012 | Ito |
| 8,247,286 B2 * | 8/2012 | Chang ............. 438/231 |
| 8,274,114 B2 | 9/2012 | Ito |
| 8,283,722 B2 | 10/2012 | Ito |
| 8,598,670 B2 | 12/2013 | Ito et al. |
| 8,765,544 B2 | 7/2014 | Ito |
| 2002/0072159 A1 | 6/2002 | Nishibe et al. |
| 2002/0137292 A1 | 9/2002 | Hossain et al. |
| 2003/0127689 A1 | 7/2003 | Hebert |
| 2004/0157379 A1 | 8/2004 | Ito et al. |
| 2004/0251492 A1 | 12/2004 | Lin |
| 2005/0052892 A1 | 3/2005 | Low et al. |
| 2005/0127442 A1 * | 6/2005 | Veeraraghavan et al. ..... 257/347 |
| 2005/0196928 A1 | 9/2005 | Bonser et al. |
| 2005/0236666 A1 | 10/2005 | Wang |
| 2006/0124999 A1 | 6/2006 | Pendharkar |
| 2006/0240653 A1 * | 10/2006 | Bhattacharyya ............. 438/581 |
| 2006/0261408 A1 | 11/2006 | Khemka et al. |
| 2006/0289933 A1 | 12/2006 | Gassner |
| 2007/0054464 A1 | 3/2007 | Zhang |
| 2007/0200195 A1 | 8/2007 | Tanaka et al. |
| 2007/0221999 A1 * | 9/2007 | Wu et al. ............. 257/384 |
| 2008/0023760 A1 | 1/2008 | Ito et al. |
| 2008/0023767 A1 | 1/2008 | Voldman |
| 2008/0036033 A1 | 2/2008 | Ito et al. |
| 2008/0054375 A1 | 3/2008 | Williford |
| 2008/0164537 A1 | 7/2008 | Cai |
| 2008/0191291 A1 * | 8/2008 | Wu et al. ............. 257/409 |
| 2008/0246080 A1 | 10/2008 | Ito et al. |
| 2008/0315306 A1 | 12/2008 | Yoo et al. |
| 2009/0032868 A1 | 2/2009 | Chen et al. |
| 2010/0052057 A1 * | 3/2010 | Chung et al. ............. 257/362 |
| 2010/0065909 A1 | 3/2010 | Ichijo |
| 2010/0090278 A1 | 4/2010 | Rohrer |
| 2010/0096697 A1 | 4/2010 | Su et al. |
| 2010/0140699 A1 * | 6/2010 | Ko ............. 257/337 |
| 2010/0295125 A1 | 11/2010 | Ito |
| 2010/0295126 A1 | 11/2010 | Ito |
| 2011/0057271 A1 | 3/2011 | Ito et al. |
| 2011/0169077 A1 | 7/2011 | Ito |
| 2011/0241112 A1 | 10/2011 | Zuniga |
| 2011/0303978 A1 | 12/2011 | Ito |
| 2012/0091525 A1 | 4/2012 | Ito |
| 2014/0084368 A1 | 3/2014 | Ito et al. |

OTHER PUBLICATIONS

Co-pending U.S. Appl. No. 13/604,207, Ito, filed Sep. 5, 2012 (not published).

* cited by examiner

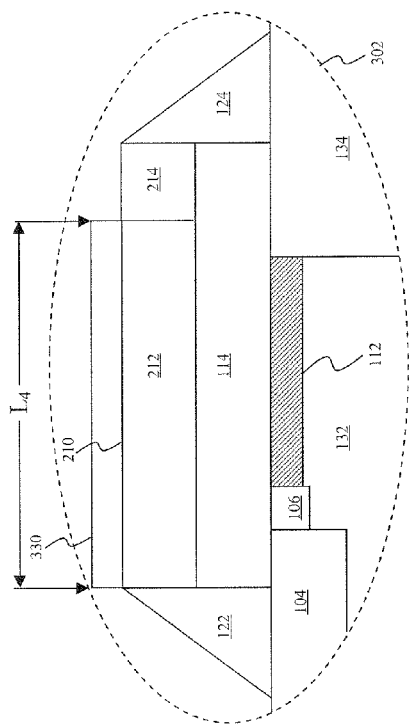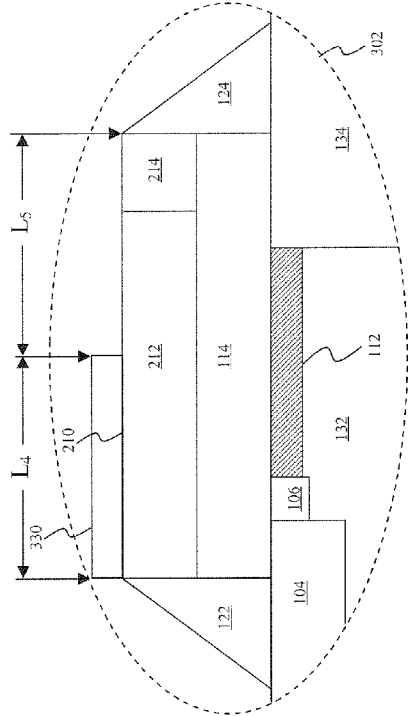
FIG. 3B
FIG. 3C

REDUCTION OF PARASITIC CAPACITANCE IN A SEMICONDUCTOR DEVICE

CROSS-REFERENCE TO RELATED APPLICATIONS

The present application claims the benefit of U.S. Provisional Patent Appl. No. 61/427,595, filed Dec. 28, 2010, which is incorporated herein by reference in its entirety.

FIELD OF THE INVENTION

The present invention generally relates to semiconductors. More specifically, the invention relates to increasing a breakdown voltage of a semiconductor device.

BACKGROUND OF THE INVENTION

Silicon semiconductor processing has evolved sophisticated operations for fabricating integrated circuits. As advancement in fabrication process technology continues, the operating voltage of the integrated circuits has decreased, but the operating voltage of auxiliary devices remains the same. Auxiliary devices are devices used in conjunction with integrated circuits and may include printers, scanners, disk drives, tape drives, microphones, speakers, and cameras to provide some examples.

Auxiliary devices may operate at voltages above the breakdown voltage of the transistors contained within the integrated circuit. As the operating voltage applied to a transistor increases, the transistor will eventually breakdown allowing an uncontrollable increase in current to pass through a junction of the transistor. Breakdown voltage is the voltage level where this uncontrollable increase in current occurs. Examples of breakdown may include punch-through, avalanche breakdown, and gate oxide breakdown to provide some examples. Operating above the breakdown voltage for a significant duration reduces the lifetime of the transistor.

Techniques are currently available to increase the voltage at which breakdown occurs. These techniques may include the separate design of input-output circuits using a high voltage process, double diffused drain or other extended drain techniques, or the cascading of two individual transistors to provide some examples. These techniques often increase the fabrication cost by requiring additional process steps along with additional substrate masking.

What is needed is a metal oxide semiconductor field effect transistor (MOSFET) device that addresses one or more of the aforementioned shortcomings of conventional MOSFET devices.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

FIG. 3B illustrates a cross-sectional view of the second n-type LDMOS structure fabricated using a CMOS logic foundry technology according to a second exemplary embodiment.

FIG. 3C illustrates a cross-sectional view of the second n-type LDMOS structure fabricated using a CMOS logic foundry technology according to a third exemplary embodiment.

Figure 1:
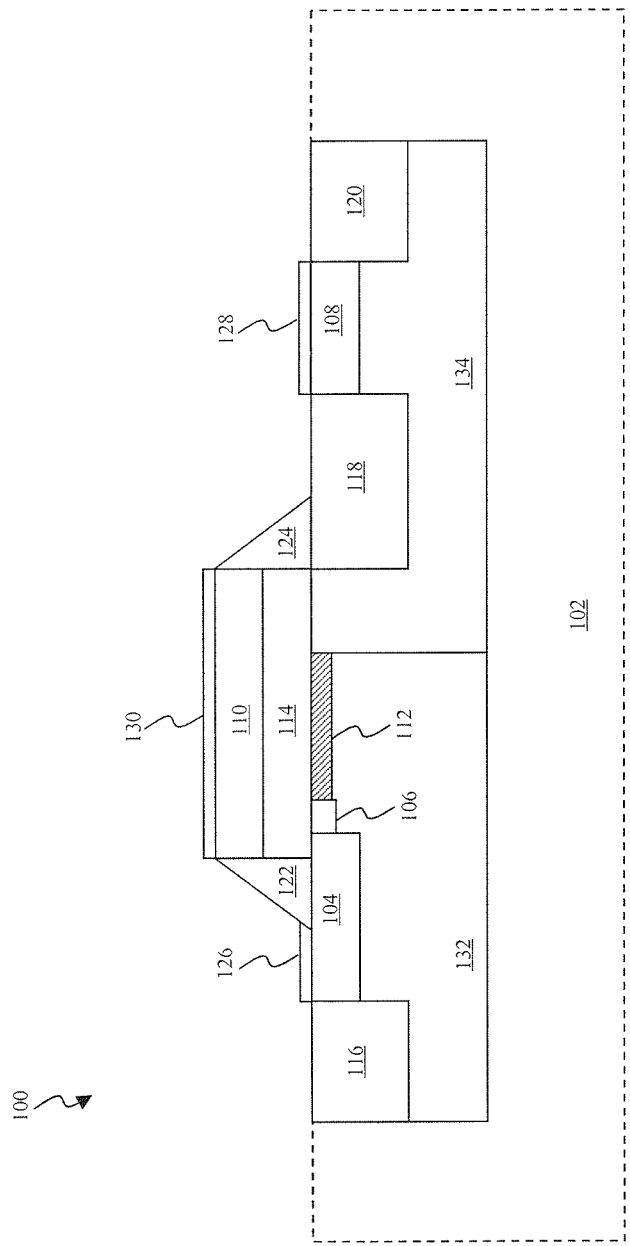
FIG. 1 illustrates a cross-sectional view of a conventional n-type laterally diffused metal oxide semiconductor (LDMOS) fabricated using a conventional complementary metal oxide semiconductor (CMOS) logic foundry technology.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s). It should be understood that relative spatial descriptions between one or more particular features, structures, or characteristics (e.g., "vertically aligned," "contact," etc.) used herein are for purposes of illustration only, and that practical implementations of the structures described herein may include fabrication and/or misalignment tolerances without departing from the spirit and scope of the present invention.

The example embodiments described herein are provided for illustrative purposes, and are not limiting. Further structural and operational embodiments, including modifications/alterations, will become apparent to persons skilled in the relevant art(s) from the teachings herein.

A Conventional Laterally Diffused Metal Oxide Semiconductor (LDMOS) Structure

FIG. 1 illustrates a cross-sectional view of a conventional n-type laterally diffused metal oxide semiconductor (LDMOS) structure fabricated using a conventional complementary metal oxide semiconductor (CMOS) logic foundry technology. The conventional CMOS logic foundry technology fabricates a conventional LDMOS structure 100 onto a substrate 102 of one conductivity type. The substrate 102 represents a physical material, commonly referred to a bulk material, on which the conventional CMOS logic foundry technology fabricates the conventional LDMOS structure 100. For example, in the exemplary embodiment of FIG. 1, the conventional CMOS logic foundry technology fabricates the conventional LDMOS structure 100 onto the substrate 102 composed with a p-type material. The p-type material includes impurity atoms of an acceptor type, such as, but not limited to, boron or aluminum to provide some examples, that are capable of accepting an electron. Doping the substrate 102 with the p-type material causes a carrier hole density in the substrate 102 to exceed a carrier electron density.

A first heavily doped region of opposite conductivity as the substrate 102 represents a source region 104 of the conventional LDMOS structure 100. Generally, implanting a comparatively small number of atoms, approximately $$\frac{5 \times 10^{18}}{cm^3} \text{ to } \frac{1 \times 10^{19}}{cm^3},$$

refers to an implanting that is low or light. Similarly, implanting a comparatively large number of atoms, approximately $$\frac{1 \times 10^{19}}{cm^3} \text{ to } \frac{5 \times 10^{20}}{cm^3},$$

refers to an implanting that is high or heavy. The source region 104 may optionally include a lightly doped region, often referred to as an LDD region 106. The LDD region 106 is of substantially similar conductivity as the source region 104 but with a lesser doping density when compared to a doping density of the source region 104.

A second heavily doped region of opposite conductivity as the substrate 102 represents a drain region 108 of the conventional LDMOS structure 100. The conventional CMOS logic foundry technology implants the source region 104 and the drain region 108 with N+ material to form a first N+ region and a second N+ region corresponding to the source region 104 and the drain region 108, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The n-type material includes impurity atoms of a donor type, such as, but not limited to, phosphorus, arsenic, or antimony to provide some examples, that are capable of donating an electron. Implanting the source region 104 and/or the drain region 108 with the n-type material causes the carrier electron density in the source region 104 and/or the drain region 108 to exceed a carrier hole density.

A third heavily doped region of opposite conductivity as the substrate 102 represents a gate region 110 of the conventional LDMOS structure 100. The conventional CMOS logic foundry technology heavily implants polycrystalline silicon with the opposite conductivity as the substrate 102 to form the gate region 110. For example, the conventional CMOS logic foundry technology implants the polycrystalline silicon with the N+ material to form an N+ poly region corresponding to the gate region 110. The gate region 110 may be positioned, or displaced, a substantially horizontal distance from the drain region 108.

The conventional LDMOS structure 100 may form a part of an interconnected array of active and passive elements integrated with, or deposited on, the substrate 102 by a continuous series of compatible processes forming an integrated circuit. The conventional LDMOS structure 100 includes shallow trench isolation (STI) regions to isolate the conventional LDMOS structure 100 from neighboring active and passive elements integrated with the substrate 102. A first STI region 116 and a second STI region 120 provide isolation and protection for the conventional LDMOS structure 100. The first STI region 116 and the second STI region 120 are adjacent to the source region 104 and the drain region 108, respectively. The conventional LDMOS structure 100 additionally includes a breakdown STI region 118 to increase a breakdown voltage of the conventional LDMOS structure 100 when compared to a similar LDMOS structure that does not include the breakdown STI region 118. The conventional CMOS logic foundry technology uses a dielectric material such as $SiO_2$, though any suitable material may be used, to fabricate the first STI region 116, the breakdown STI region 118, and/or the second STI region 120. The conventional LDMOS structure 100 further includes a layer of silicide, typically an alloy of metal and silicon, formed upon the source region 104, the drain region 108, and the gate region 110 to form interconnections between other devices within the integrated circuit. A first silicide layer 126, a second silicide layer 128, and a third silicide layer 130 are formed upon the source region 104, the drain region 108, and the gate region 110, respectively, to form the interconnections between these regions and the other devices within the integrated circuit.

The conventional LDMOS structure 100 additionally includes spacers to isolate the source region 104, the drain region 108, and/or the gate region 110. The conventional LDMOS structure 100 includes a first spacer 122 to isolate the source region 104 and the gate region 110. Likewise, the conventional LDMOS structure 100 includes a second spacer 124 to isolate the drain region 108 and the gate region 110. The conventional CMOS logic foundry technology fabricates the first spacer 122 and/or the second spacer 124 using a dielectric material, such as $SiO_2$, though any suitable material may be used.

Operation of the Conventional LDMOS Structure

Applying a first potential, such as a positive direct current (DC) voltage to provide an example, to the gate region 110 and applying a second potential, such as a ground potential to provide an example, to the source region 104 causes a voltage to appear between the gate region 110 and the source region 104. The first potential on the gate region 110 repels the positively charged carrier holes from a bottom side of the gate region 110 to form a channel region 112. The channel region 112 represents a carrier-depletion region populated by a negative charge formed at a bottom side of a gate oxide 114 by an electric field. This electric field also attracts carrier electrons from the source region 104 and the drain region 108 into the channel region 112. An n-type region connecting the source region 104 to the drain region 108 forms after a sufficient number of carrier electrons have accumulated in the channel region 112 allowing a current to pass through the channel region 112.

Specially implanted regions, known as wells, may increase the number of carrier holes and/or carrier electrons located in the substrate 102. For example, increasing the number of carrier holes in the substrate 102 requires a greater number of carrier electrons to form the depletion region. The conventional CMOS logic foundry technology may implant the substrate 102 with the p-type material and the n-type material to fabricate a specially implanted p-type region, denoted as p-well region 132, and a specially implanted n-type region, denoted as n-well region 134, respectively.

Further discussion of the conventional LDMOS structure 100 is given in U.S. patent application Ser. No. 11/580,961, filed on Oct. 16, 2006, which is incorporated by reference in its entirety.

Breakdown Voltage of the Conventional LDMOS Structures

There is a point, known as the breakdown voltage, where the current passing through the channel region 112 increases uncontrollably resulting in breakdown of the conventional LDMOS structure 100. Examples of breakdown may include avalanche breakdown, punch-through, and/or gate oxide breakdown. Other examples of breakdown are possible that will be apparent to those skilled in the relevant art(s) without departing from the spirit and scope of the present invention. A drain to source resistance of the conventional LDMOS structure 100, namely a resistance from the drain region 108 to the source region 104, influences the breakdown voltage. The conventional LDMOS structure 100 maximizes this drain to source resistance to provide a large breakdown voltage. However, this maximization of the drain to source resistance undesirably increases an effective parasitic capacitance of the conventional LDMOS structure 100, thereby impeding a frequency response of the conventional LDMOS structure 100. For example, this maximization of the drain to source resistance increases a first parasitic capacitance between the p-well region 132 and the n-well region 134, commonly referred to as a junction capacitance, and/or a second parasitic capacitance between the gate region 110 and the n-well region 134, commonly referred to as an overlap capacitance. A large junction capacitance and/or a large overlap capacitance prevent these parasitic capacitances from fully charging and/or discharging when in a presence of a rapidly changing electrical signal. In this situation, the inability of the large junction capacitance and/or the large overlap capacitance to fully charge and/or discharge causes these rapidly changing electrical signals to distort as they pass through the conventional LDMOS structure 100.

A First Laterally Diffused Metal Oxide Semiconductor (LDMOS) Structure

Embodiments of the LDMOS structures of the present invention effectively lower its drain to source resistance from that of the conventional LDMOS structure 100 to increase a frequency response. This lowering of the drain to source resistance effectively decreases the junction capacitance and/or the overlap capacitance when compared to the conventional LDMOS structure 100. However, this lesser drain to source resistance results in a lower breakdown voltage when compared to the conventional LDMOS structure 100.

Figure 2A:
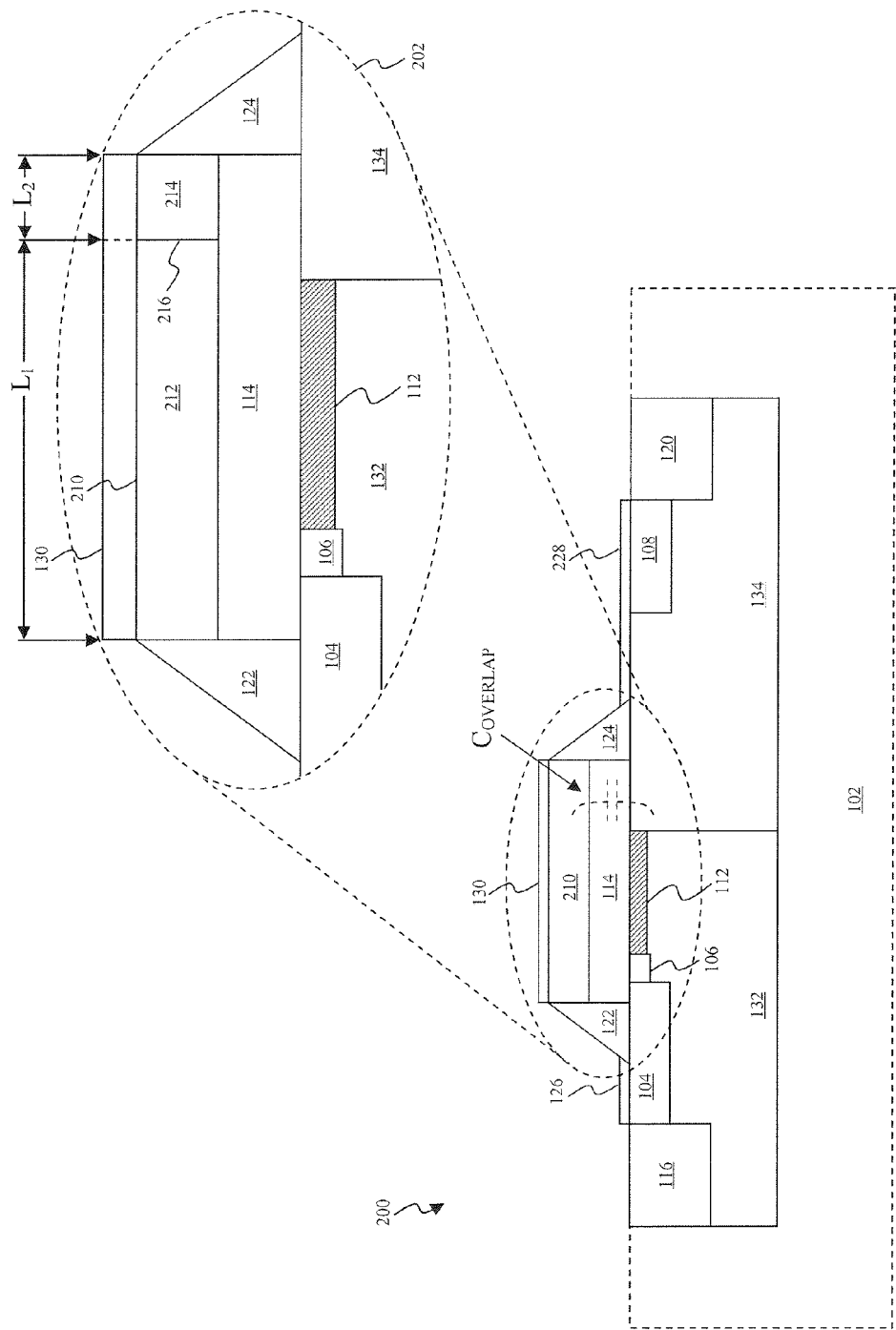
FIG. 2A illustrates a cross-sectional view of a first n-type LDMOS structure fabricated using a CMOS logic foundry technology according to a first exemplary embodiment.

FIG. 2A illustrates a cross-sectional view of a first n-type LDMOS structure fabricated using a CMOS logic foundry technology according to a first exemplary embodiment. A LDMOS structure 200 may be characterized as having an improved frequency response when compared to the frequency response of the conventional LDMOS structure 100. Specifically, the LDMOS structure 200 may be characterized as having a lesser parasitic capacitance, referred to as an overlap capacitance $C_{OVERLAP}$, between the n-well region 134 and a modified gate region when compared to a similar parasitic overlap capacitance of the conventional LDMOS structure 100. A complementary metal oxide semiconductor (CMOS) logic foundry technology fabricates the LDMOS structure 200 in a substantially similar manner as the conventional LDMOS structure 100 as described above. Therefore, only differences between the LDMOS structure 200 and the conventional LDMOS structure 100 are to be described in further detail.

Figure 2B:
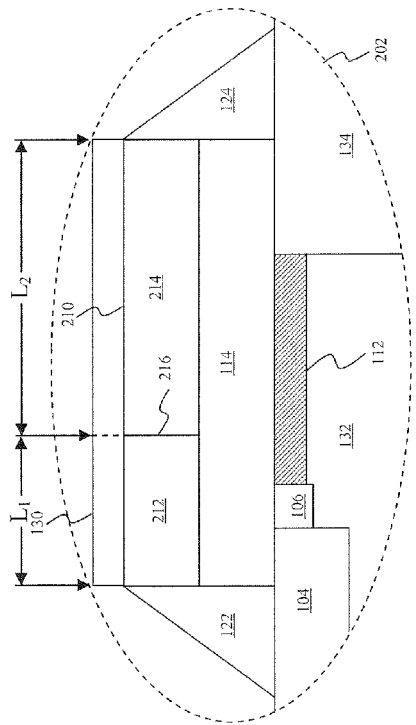
FIG. 2B illustrates a cross-sectional view of the first n-type LDMOS structure fabricated using a CMOS logic foundry technology according to a second exemplary embodiment.
Figure 2C:
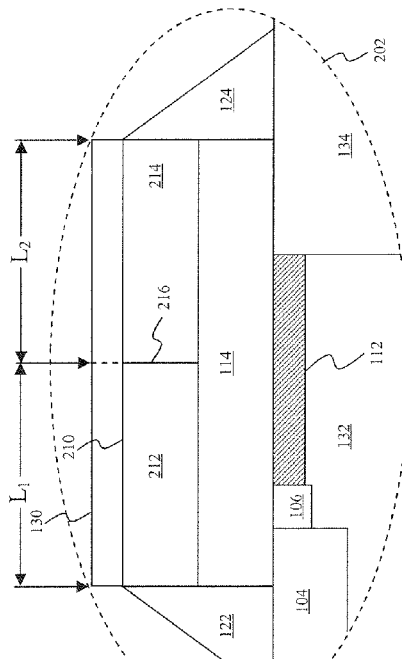
FIG. 2C illustrates a cross-sectional view of the first n-type LDMOS structure fabricated using a CMOS logic foundry technology according to a third exemplary embodiment.

The LDMOS structure 200 includes a modified gate region 210 to effectively decrease the overlap capacitance $C_{OVERLAP}$ of the LDMOS structure 200. Unlike the gate region 110 of the conventional LDMOS structure 100, the polycrystalline silicon region that forms the modified gate region 210 is only partially doped. As illustrated in an exploded view 202 of FIG. 2A, the modified gate region 210 includes a doped region 212 and an undoped region 214 that are adjacent to one another. The doped region 212 represents a first region of the modified gate region 210 that may be heavily or lightly implanted with a dopant such as the n-type material to provide an example. The undoped region 214 represents a second region of the modified gate region 210 that is not implanted with the dopant. As additionally shown in the exploded view 202, the doped region 212 may be characterized as having a substantially horizontal length $L_1$ that is greater than a substantially horizontal length $L_2$ of the undoped region 214. In an exemplary embodiment, the substantially horizontal length $L_1$ and the substantially horizontal length $L_2$ is approximately 0.32 μm and 0.12 μm, respectively. However, this example is not limiting, those skilled in the relevant art(s) will recognize that the substantially horizontal length $L_1$ may be less than the substantially horizontal length $L_2$ as depicted in FIG. 2B or the substantially horizontal length $L_1$ may be equal to the substantially horizontal length $L_2$ as depicted in FIG. 2C without departing from the spirit and scope of the present invention.

As additionally illustrated in the exploded view 202 of FIG. 2A, a transition between the doped region 212 and the undoped region 214 is represented as a junction region 216. Although the junction region 216 illustrates a substantially vertical transition between the doped region 212 and the undoped region 214 in FIG. 2A, those skilled in the relevant art(s) will recognize that the junction region 216 represents any region in the modified gate region 210 that indicates a transition from an undoped region to a doped region without departing from the spirit and scope of the present invention. For example, the junction region 216 may represent a non-vertical transition, such as a curved transition, or any other linear transition, such as a diagonal transition, to provide some examples. As further illustrated in the exploded view 202 of FIG. 2A, the n-well region 134 overlaps the junction 216. However, this example is not limiting, those skilled in the relevant art(s) will recognize that the p-well region 132 may overlap the junction region 216 as depicted in FIG. 2B and FIG. 2C without departing from the spirit and scope of the present invention.

Referring back to FIG. 2A, a capacitance of a parallel plate, such as the overlap capacitance $C_{OVERLAP}$ to provide an example, may be approximated by:

$$C = \frac{\varepsilon A}{d}, \quad (1)$$

where C represents the capacitance of the overlap capacitance $C_{OVERLAP}$, $\varepsilon$ represents a dielectric constant of the gate oxide 114, A represents an effective area of the modified gate region 210, and d represents a distance between the modified gate region 210 and the n-well region 134. The undoped region 214 of the modified gate region 210 effectively reduces the effective area A of the modified gate region 210 when compared to the effective area A of the gate region 110 of the conventional LDMOS structure 100 which is completely implanted with the n-type material. This reduction in the effective area A of the modified gate region 210 reduces the overlap capacitance $C_{OVERLAP}$ of the LDMOS structure 200 when compared to a similar overlap capacitance $C_{OVERLAP}$ of the conventional LDMOS structure 100.

As additionally illustrated in FIG. 2A, the LDMOS structure 200 does not include a breakdown STI region, such as the breakdown STI region 118 of the conventional LDMOS structure 100, between the drain region 108 and the modified gate region 210. However, the undoped region 214 provides additional separation between the effective gate region, namely the doped region 212 and the drain region 108. Therefore, the breakdown voltage of the LDMOS structure 200 is typically greater than a similar LDMOS structure having its gate region entirely doped.

As further shown in illustrated in FIG. 2A, the LDMOS structure 200 includes a modified silicide region 228. The modified silicide region 228 represents a layer of silicide, typically an alloy of metal and silicon, formed upon the drain region 108 to form an interconnection between the drain region 108 and other devices within the integrated circuit. The modified silicide region 228 extends from the drain region 108 to the second spacer 124.

A Second Laterally Diffused Metal Oxide Semiconductor (LDMOS) Structure

Figure 3A:
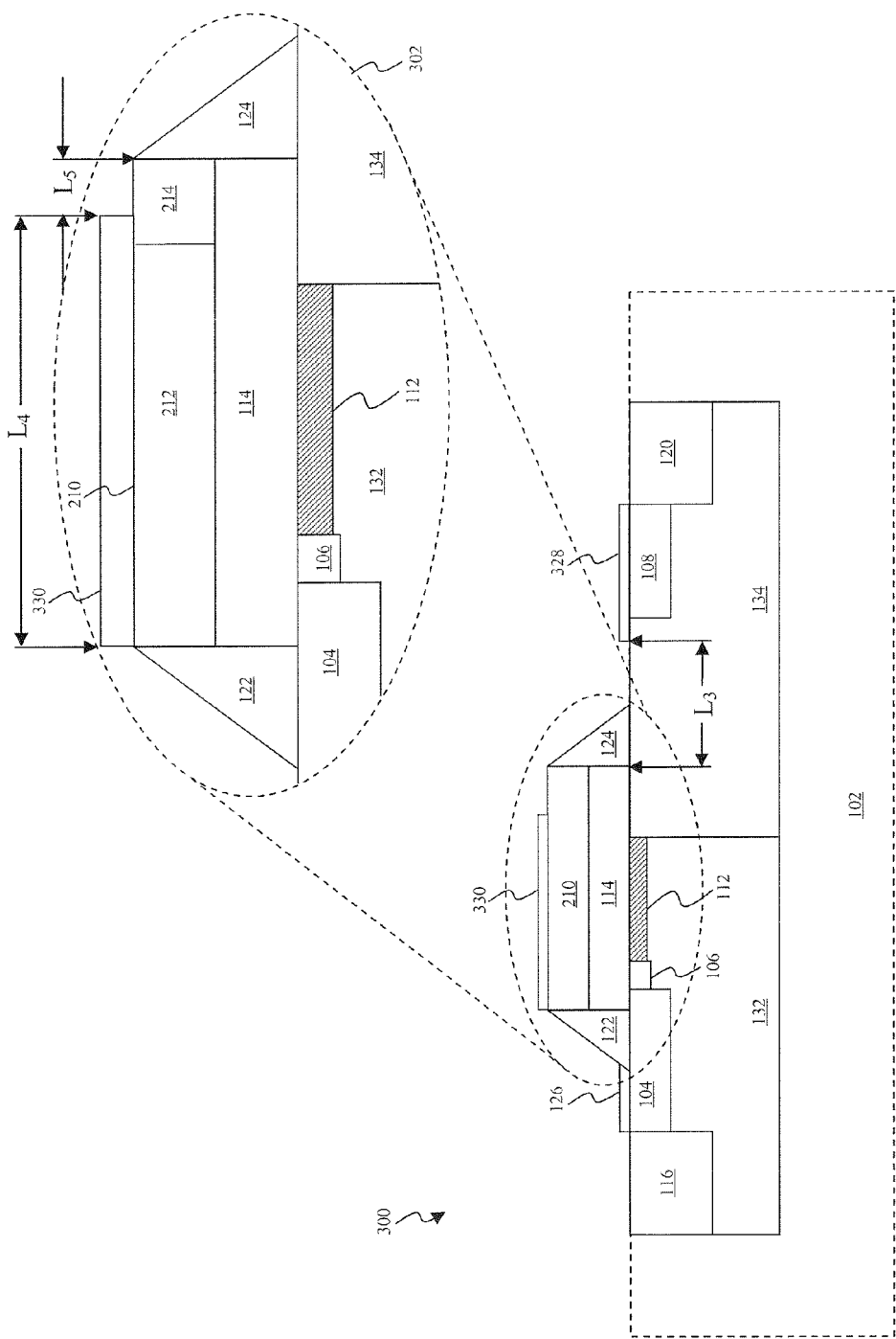
FIG. 3A illustrates a cross-sectional view of a second n-type LDMOS structure fabricated using a CMOS logic foundry technology according to a first exemplary embodiment.

FIG. 3A illustrates a cross-sectional view of a second n-type LDMOS structure fabricated using a CMOS logic foundry technology according to a first exemplary embodiment. The LDMOS structure 300 reduces unwanted electrical interactions, such as a fringing effect to provide an example, between the silicide region formed upon the modified gate region 210 and the silicide region formed upon the drain region 108. The LDMOS structure 300 includes a modified silicide region 328 and a modified silicide region 330 to further separate these two regions from each other when compared to similar regions of the LDMOS structure 200. A CMOS logic foundry technology fabricates the LDMOS structure 300 in a substantially similar manner as the LDMOS structure 200 as described above. Therefore, only differences between the LDMOS structure 200 and the LDMOS structure 300 are to be described in further detail.

As shown in FIG. 3A, the modified silicide region 328 is displaced a substantially horizontal distance $L_3$ from the modified gate region 210. The modified silicide region 328 may extend beyond the drain region 108 toward the modified gate region 210 and be partially formed upon the n-well region 134. However, this example is not limiting, those skilled in the relevant art(s) will recognize that the substantially horizontal distance $L_3$ may extend beyond the n-well region 134 into the drain region 108 without departing from the spirit and scope of the present invention. As a result, the modified silicide region 328 need not extend beyond the drain region 108. Rather, the modified silicide region 328 may be formed upon the drain region 108 lacking contact with the n-well region 134 and/or may be partially formed upon the second STI region 120.

As illustrated in an exploded view 302 of FIG. 3A, the modified silicide region 330 may be characterized by a substantially horizontal length $L_4$ and a substantially horizontal length $L_5$. The substantially horizontal length $L_4$ of the modified silicide region 330 is greater than the substantially horizontal length $L_1$ of the doped region 212 causing the modified silicide region 330 to be partially formed upon the undoped region 214. However, this example is not limiting, those skilled in the relevant art(s) will recognize that the substantially horizontal length $L_4$ of the modified silicide region 330 may be equal to the substantially horizontal length $L_1$ of the doped region 212 as depicted in FIG. 3B or less than the substantially horizontal length $L_1$ of the doped region 212 as depicted in FIG. 3C without departing from the spirit and scope of the present invention.

Figure 3D:
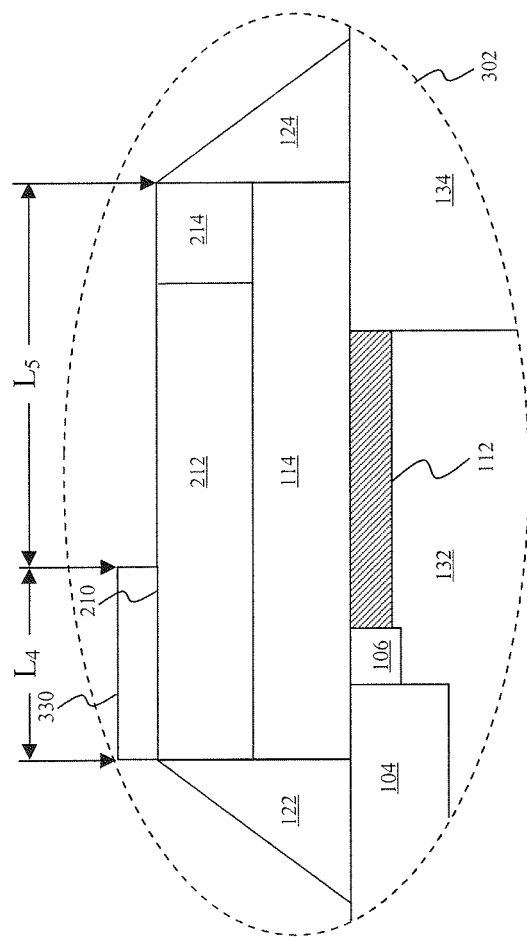
FIG. 3D illustrates a cross-sectional view of the second n-type LDMOS structure fabricated using a CMOS logic foundry technology according to a fourth exemplary embodiment.

As additionally illustrated in the exploded view 302, the modified silicide region 330 may be displaced from the modified gate region 210 by the substantially horizontal length $L_5$. The substantially horizontal length $L_5$ may be less than the substantially horizontal length $L_4$. However, this example is not limiting, those skilled in the relevant art(s) will recognize that the substantially horizontal length $L_5$ of the modified silicide region 330 may be equal to the substantially horizontal length $L_4$ as depicted in FIG. 3C or greater than the substantially horizontal length $L_4$ as depicted in FIG. 3D without departing from the spirit and scope of the present invention.

A Third Laterally Diffused Metal Oxide Semiconductor (LDMOS) Structure

Figure 4:
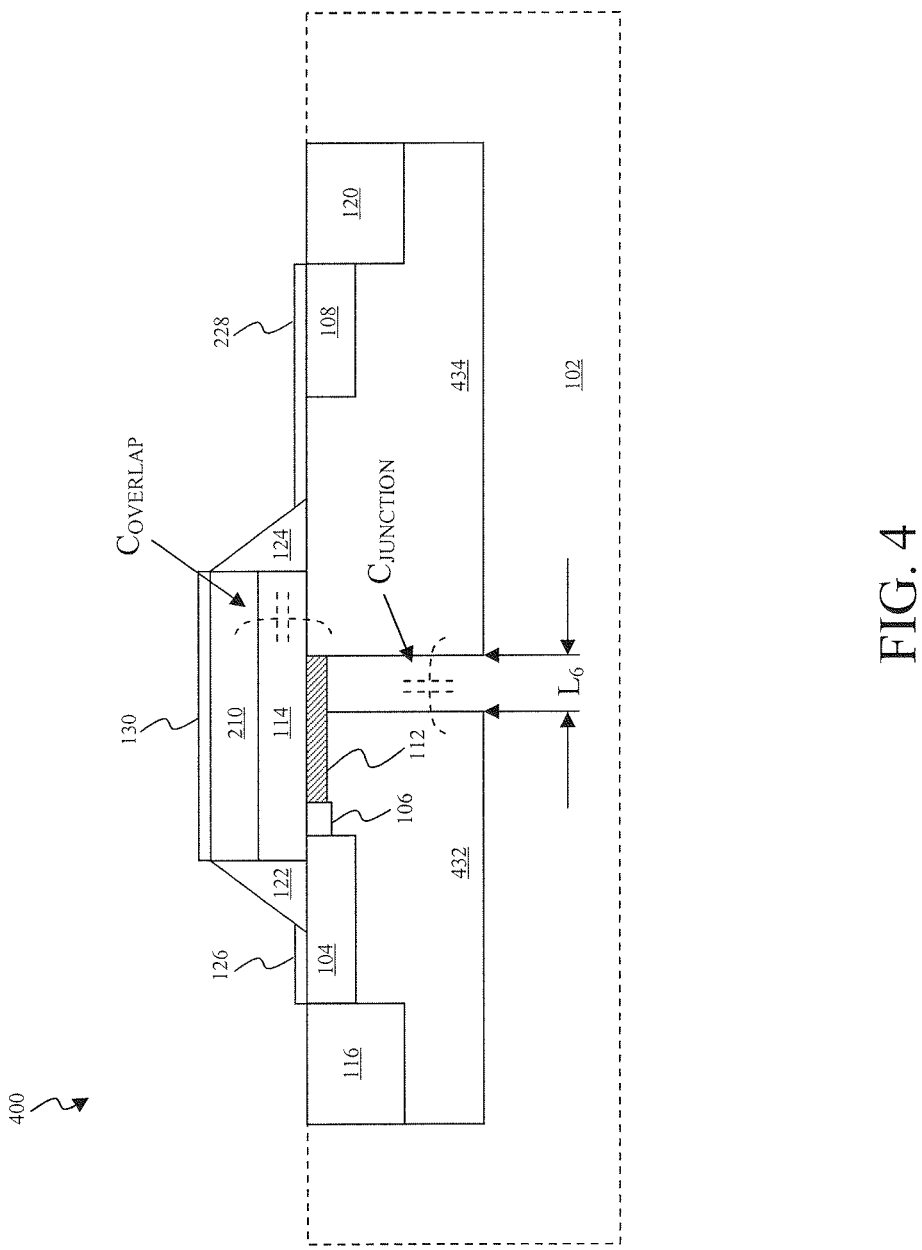
FIG. 4 illustrates a cross-sectional view of a third n-type LDMOS structure fabricated using a CMOS logic foundry technology according to a first exemplary embodiment.

FIG. 4 illustrates a cross-sectional view of a third n-type LDMOS structure fabricated using a CMOS logic foundry technology according to a first exemplary embodiment. A LDMOS structure 400 may be characterized as having an improved frequency response when compared to the frequency response of the conventional LDMOS structure 100. Specifically, the LDMOS structure 400 may be characterized as having a lesser first parasitic capacitance, referred to as an overlap capacitance $C_{OVERLAP}$, between a modified n-well region and the modified gate region 210 and a lesser second parasitic capacitance, referred to as a junction capacitance $C_{JUNCTION}$, between the modified n-well region and a modified p-well region when compared similar parasitic capacitances of the conventional LDMOS structure 100. A complementary metal oxide semiconductor (CMOS) logic foundry technology fabricates the LDMOS structure 400 in a substantially similar manner as the LDMOS structure 200 as described above. Therefore, only differences between the LDMOS structure 400 and the LDMOS structure 200 are to be described in further detail.

The LDMOS structure 400 includes a modified p-well region 432 and a modified n-well region 434 to effectively decrease the junction capacitance $C_{JUNCTION}$ of the LDMOS structure 400. The CMOS logic foundry technology may implant the substrate 102 with the p-type material and the n-type material to fabricate the modified p-well 432 and the modified n-well region 434, respectively. As shown in FIG. 4, the modified p-well region 432 extends from the source region 104 to beneath the modified gate region 210. Similarly, the modified n-well region 434 extends from the drain region 108 to beneath the modified gate region 210. A substantially horizontal length $L_6$ substantially separates the modified p-well region 432 from contacting the modified n-well region 434. In an exemplary embodiment, the substantially horizontal length $L_6$ is between approximately 0.05 μm and approximately 0.1 μm. However, this example is not limiting, those skilled in the relevant art(s) will recognize that other lengths for the substantially horizontal length $L_6$ are possible without departing from the spirit and scope of the present invention.

Referring to FIG. 4, a capacitance of a parallel plate, such as the junction capacitance $C_{JUNCTION}$ to provide an example, may be approximated by:

$$C = \frac{\varepsilon A}{d}, \quad (2)$$

where C represents the capacitance of the junction capacitance $C_{JUNCTION}$, $\in$ represents a dielectric constant of the substrate 102, A represents an effective area of the modified p-well region 432 and/or the modified n-well region 434, and d represents a distance between the modified p-well region 432 and the modified n-well region 434, namely the substantially horizontal length $L_6$. The substantially horizontal length $L_6$ effectively increases the distance d between the modified p-well region 432 and the modified n-well region 434 when compared to the distance d between the p-well region 132 and the n-well region 134 of the conventional LDMOS structure 100. This reduction in the distance d reduces the junction capacitance $C_{JUNCTION}$ of the LDMOS structure 400 when compared to a similar junction capacitance $C_{JUNCTION}$ of the conventional LDMOS structure 100.

A Fourth Laterally Diffused Metal Oxide Semiconductor (LDMOS) Structure

Figure 5:
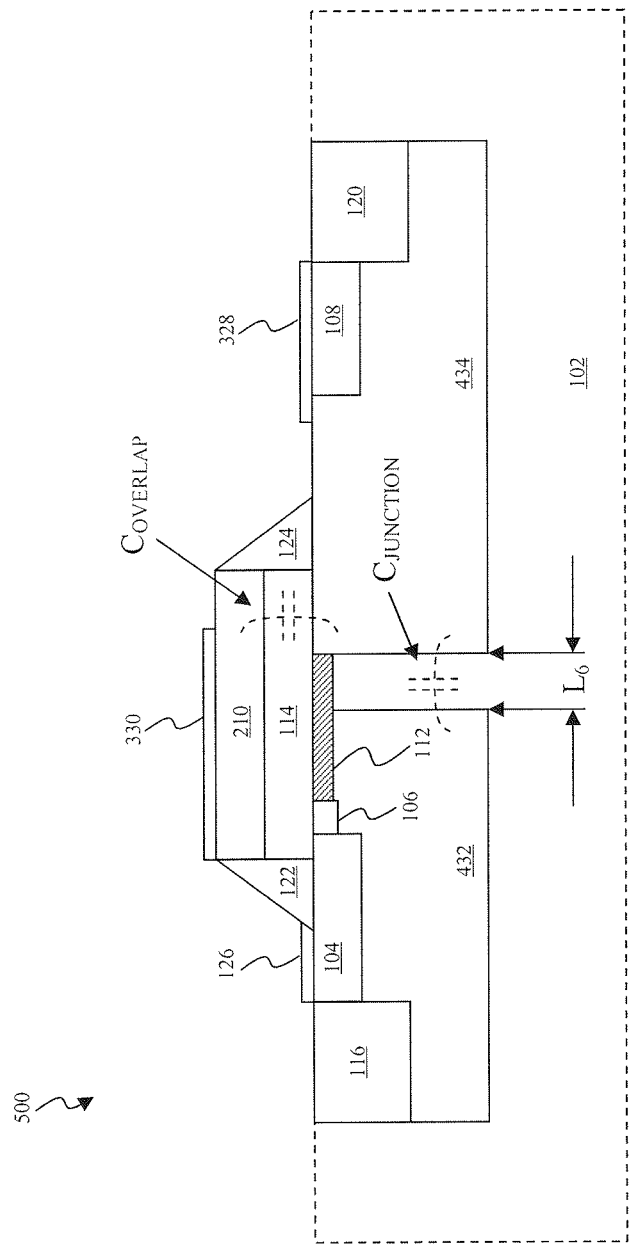
FIG. 5 illustrates a cross-sectional view of a fourth n-type LDMOS structure fabricated using a CMOS logic foundry technology according to a first exemplary embodiment.

FIG. 5 illustrates a cross-sectional view of a third n-type LDMOS structure fabricated using a CMOS logic foundry technology according to a first exemplary embodiment. A complementary metal oxide semiconductor (CMOS) logic foundry technology fabricates a LDMOS structure 500 in a substantially similar manner as the conventional LDMOS structure 400 as described above. Therefore, only differences between the LDMOS structure 400 and the LDMOS structure 500 are to be described in further detail. As shown in FIG. 5, the LDMOS structure 500 includes the modified silicide region 328 and modified silicide region 330 as discussed in FIG. 3A through FIG. 3C.

CONCLUSION

Although the LDMOS structures of the present invention have been described as n-type structures those skilled in the relevant art(s) will recognize that p-type structures may be similarly formed by using p-type material instead of n-type material without departing from the spirit and scope of the present invention. These p-type structures may be implanted into a deep n-well region formed within a p-type semiconductor substrate and/or directly implanted into an n-type semiconductor substrate. Additionally, those skilled in the relevant art(s) will recognize that the substrate as described herein may be composed of n-type material without departing from the spirit and scope of the present invention. In this situation, the LDMOS structures of the present invention may be implanted into a deep p-well region formed within the n-type semiconductor substrate.

While various embodiments of the present invention have been described above, it should be understood that they have been presented by way of example, and not limitation. It will be apparent to persons skilled in the relevant art(s) that various changes in form and detail may be made therein without departing from the spirit and scope of the invention. Thus the present invention should not be limited by any of the above-described exemplary embodiments, but should be defined only in accordance with the following claims and their equivalents.

What is claimed is:

1. A semiconductor device, comprising:
    a first region forming a source region;
    a second region forming a drain region;
    a third region forming a gate region between the source region and the drain region, the gate region having a first vertical side and a second vertical side and including a doped region and an undoped region, the doped region extending from the first vertical side of the gate region to a third vertical side and the undoped region extending from the third vertical side to the second vertical side of the gate region;
    a silicide region formed onto the gate region, the silicide region not contacting at least a portion of a top side of the undoped region;
    a first well region extending from a fourth vertical side to a fifth vertical side;
    a second well region extending from a sixth vertical side to a seventh vertical side, at least a portion of the fifth vertical side of the first well region contacting at least a portion of the sixth vertical side of the second well region beneath the undoped region;
    a first spacer formed between the first region and the gate region, the first spacer contacting at least a portion of the first vertical side of the gate region; and
    a second spacer formed between the second region and the gate region, the second spacer contacting at least a portion of the second vertical side of the gate region.

2. The semiconductor device of claim 1, wherein the doped region represents a first region within the gate region that is implanted with a dopant and the undoped region represents a second region within the gate region that is not implanted with the dopant.

3. The semiconductor device of claim 2, wherein the dopant is an n-type material.

4. The semiconductor device of claim 2, wherein the dopant is a p-type material.

5. The semiconductor device of claim 2, wherein the doped region is heavily implanted with the dopant.

6. The semiconductor device of claim 2, wherein the doped region is lightly implanted with the dopant.

7. The semiconductor device of claim 1, wherein the doped region is characterized as having a first length and the undoped region is characterized as having a second length.

8. The semiconductor device of claim 7, wherein the first length is less than the second length.

9. The semiconductor device of claim 7, wherein the first length is approximately equal to the second length.

10. The semiconductor device of claim 1, wherein the third vertical side represents a transition between the doped region and the undoped region.

11. The semiconductor device of claim 1, wherein the source region and the drain region are implanted with an n-type material.

12. The semiconductor device of claim 1, wherein the source region and the drain region are implanted with a p-type material.

13. The semiconductor device of claim 1, wherein the silicide region is characterized as having a first length that is greater than a length of the doped region; and further comprising:
    a second silicide region formed onto the drain region and displaced from the gate region by a second length.

14. The semiconductor device of claim 13, wherein the second silicide region extends beyond the drain region toward the gate region.

15. The semiconductor device of claim 1, wherein the first well region extends from the source region to the second well region; and
    wherein the second well region extends from the drain region to the first well region.

16. The semiconductor device of claim 1, wherein the first and the second well regions are p-type and n-type regions, respectively.

17. The semiconductor device of claim 1, wherein the fifth vertical side of the first well region contacts at least a portion of the sixth vertical side of the second well region beneath the silicide region.

18. The semiconductor device of claim 1, wherein the first and second spacers contact at least a portion of the first and second well regions, respectively.

19. A semiconductor device, comprising:
    a source region;
    a drain region;
    a gate region formed between the source region and the drain region, the gate region having a first vertical side and a second vertical side and including a doped region and an undoped region, the doped region extending from the first vertical side of the gate region to a third vertical side and the undoped region extending from the third vertical side to the second vertical side of the gate region;
    a first well region extending from a fourth vertical side to a fifth vertical side;
    a second well region extending from a sixth vertical side to a seventh vertical side, at least a portion of the fifth vertical side of the first well region contacting at least a portion of the sixth vertical side of the second well region beneath the undoped region;
    a first spacer formed between the source region and the gate region, the first spacer contacting at least a portion of the first vertical side of the gate region; and
    a second spacer formed between the drain region and the gate region, the second spacer contacting at least a portion of the second vertical side of the gate region.

20. The semiconductor device of claim 19, wherein the doped region represents a first region within the gate region that is implanted with a dopant and the undoped region represents a second region within the gate region that is not implanted with the dopant.

21. The semiconductor device of claim 20, wherein the dopant is an n-type material.

22. The semiconductor device of claim 20, wherein the dopant is a p-type material.

23. The semiconductor device of claim 19, wherein the doped region is characterized as having a first length and the undoped region is characterized as having a second length.

24. The semiconductor device of claim 23, wherein the first length is less than the second length.

25. The semiconductor device of claim 23, wherein the first length is approximately equal to the second length.

26. The semiconductor device of claim 19, wherein the third vertical side represents a transition between the doped region and the undoped region.

27. The semiconductor device of claim 19, wherein the first well region extends from the source region to the second well region; and
    wherein the second well region extends from the drain region to the first well region.

28. The semiconductor device of claim 19, wherein the first and second well regions are p-type and n-type regions, respectively.

29. The semiconductor device of claim 19, wherein the first and second spacers contact at least a portion of the first and second well regions, respectively.

* * * * *

UNITED STATES PATENT AND TRADEMARK OFFICE
CERTIFICATE OF CORRECTION

| | | |
|---|---|---|
| PATENT NO. | : 9,123,807 B2 | Page 1 of 1 |
| APPLICATION NO. | : 13/019695 | |
| DATED | : September 1, 2015 | |
| INVENTOR(S) | : Akira Ito | |

It is certified that error appears in the above-identified patent and that said Letters Patent is hereby corrected as shown below:

In the Title Page, Item 57, replace "increase a reduced a parasitic capacitance" with --increase a reduced parasitic capacitance--.

Signed and Sealed this
Fifth Day of July, 2016

Michelle K. Lee
*Director of the United States Patent and Trademark Office*